US006885555B2

(12) United States Patent
Greco

(10) Patent No.: US 6,885,555 B2
(45) Date of Patent: Apr. 26, 2005

(54) COOLING SYSTEM FOR ELECTRONIC DEVICES

(75) Inventor: David Greco, Varces (FR)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/379,997

(22) Filed: Mar. 6, 2003

(65) Prior Publication Data

US 2004/0004817 A1 Jan. 8, 2004

(30) Foreign Application Priority Data

Mar. 7, 2002 (EP) ............................................ 02354041

(51) Int. Cl.⁷ ................................................ H05K 7/20
(52) U.S. Cl. .................. 361/695; 361/690; 165/104.11; 165/168
(58) Field of Search ................................ 361/676, 678, 361/690–695, 697, 717–719; 257/706, 707; 165/54, 57, 59, 104.11, 104.34, 154, 168, 169; 312/236

(56) References Cited

U.S. PATENT DOCUMENTS

| 3,305,704 | A | * | 2/1967 | Battista ...................... 361/690 |
| 4,520,425 | A |   | 5/1985 | Ito |
| 5,091,823 | A | * | 2/1992 | Kanbara et al. ............ 361/697 |
| 5,253,613 | A | * | 10/1993 | Bailey et al. ............. 123/41.31 |
| 5,422,787 | A | * | 6/1995 | Gourdine .................... 361/697 |
| 5,559,673 | A | * | 9/1996 | Gagnon et al. ............. 361/695 |
| 5,566,377 | A | * | 10/1996 | Lee ............................ 361/695 |
| 5,641,588 | A | * | 6/1997 | Sieminski et al. ............ 429/98 |
| 5,704,212 | A | * | 1/1998 | Erler et al. .................... 62/3.2 |
| 5,785,116 | A |   | 7/1998 | Wagner |
| 5,801,632 | A | * | 9/1998 | Opal .......................... 340/585 |
| 5,816,319 | A |   | 10/1998 | Kamekawa et al. |
| 5,862,037 | A | * | 1/1999 | Behl .......................... 361/687 |
| 5,869,919 | A | * | 2/1999 | Sato et al. .................... 313/17 |
| 5,917,698 | A |   | 6/1999 | Viallet |
| 5,959,836 | A | * | 9/1999 | Bhatia ........................ 361/687 |
| 5,978,219 | A | * | 11/1999 | Lin ............................ 361/697 |
| 5,986,883 | A | * | 11/1999 | Johnson et al. ............. 361/695 |
| 6,088,223 | A |   | 7/2000 | Diemunsch |
| 6,094,345 | A |   | 7/2000 | Diemunsch |
| 6,111,748 | A |   | 8/2000 | Bhatia |
| 6,157,539 | A |   | 12/2000 | Wagner et al. |
| 6,233,149 | B1 | * | 5/2001 | Bailey et al. ............... 361/704 |
| 6,359,779 | B1 | * | 3/2002 | Frank et al. ................ 361/687 |
| 6,522,535 | B1 | * | 2/2003 | Helot et al. ................. 361/687 |
| 6,570,760 | B1 | * | 5/2003 | Wang ......................... 361/687 |
| 6,599,090 | B1 | * | 7/2003 | Ozaki et al. ................ 415/206 |

\* cited by examiner

*Primary Examiner*—Anatoly Vortman

(57) ABSTRACT

A cooling system for an electronic device includes an air flow conduit for causing air outside a housing of the device to flow through a heat dissipation device. The conduit is configured to prevent substantial transfer of heat from air contained within the conduit and air in the remainder of the housing. The conduit walls include thermal and/or acoustic insulation. One or more fans in the conduit draw outside air into the conduit and expel air in the conduit to outside the housing.

15 Claims, 3 Drawing Sheets

COOLING SYSTEM FOR ELECTRONIC DEVICES

FIELD OF THE INVENTION

This invention relates generally to electronic devices and more particularly to a cooling arrangement for cooling heat generating components of electronic devices, particularly, but not exclusively, personal computers.

BACKGROUND OF THE INVENTION

Electronic devices, e.g., computer systems, electronic entertainment systems, and the like, typically include components, e.g., processors, micro-controllers, high speed video cards, disk drives, semi-conductor devices, and the like, that generate considerable amounts of heat.

It is generally known that relatively high temperatures can negatively affect the performance and operating lives of these components. This problem is further exacerbated with the continuing advances in electronic device performance which has led to increases in both the number of heat generating components included in the electronic devices and the amount of heat generated by the some of the components. For instance, the processor alone of a modern personal computer can generate up to 80 watts of heat.

Operation of the heat generating components at temperatures above a predetermined range can result in irreversible damage. In addition, it has been established that the reliabilities of semiconductor electronic devices decrease with increasing operating temperatures. Therefore, the heat energy produced by the components during operation must be removed at a rate which substantially ensures that operational and reliability requirements are met.

In order to substantially maintain proper operation of the heat generating components and to substantially extend their useful lives, it is generally known to provide one or more mechanisms to cool the components. The mechanisms are typically designed to remove the heat energy from electronic packages in computers. For instance, conventional mechanisms often incorporate one or more fans to provide forced air cooling of the components. In these types of mechanisms, air flow is achieved by drawing air into an electronic device housing from an exterior thereof. Air that is drawn into the housing typically passes through a chassis area over the components, thereby cooling the components through direct contact.

Another mechanism conventionally implemented to assist in the cooling of heat generating components are heat sinks. Heat sinks are often metal plate structures, e.g., generally upstanding fins, designed to be directly attached to heat generating components in order to draw heat therefrom. Heat sinks can include a fan to remove the heat accumulated on the metal plate structures.

Just a few examples of the many and various cooling mechanisms that have been used and proposed in personal computers are found in U.S. Pat. Nos. 6,088,223, 6,094,345 and U.S. Pat. No. 5,917,698, for instance. U.S. Pat. No. 5,785,116 describes a fan assisted heat sink device in which the heat sink assembly also forms the housing surrounding the fan. U.S. Pat. No. 6,157,539 describes a similar type of heat sink in which a divider member separates the intake and exhaust air flow paths.

Although known cooling mechanisms have, no doubt, been relatively suitable for their intended uses, there can be several drawbacks and disadvantages associated with their use and their adoption to situations where successive generations of components generate ever increasing amounts of heat. For instance, in many applications it is not suitable to simply increase the power of fans used for cooling since this would inevitably increase the acoustic noise generated by the apparatus. Neither is it possible to increase the size of heat sinks. Large heat sinks are relatively expensive because of the materials used and frequently need to be mounted to the exterior of a casing and can thus be unsightly and inappropriate for many designs. It is therefore not sufficient in many instances to simply scale up the known solutions.

This invention is directed to providing an improved cooling mechanism for electronic apparatus, particularly personal computers, that can, at reasonable cost, accommodate the increasing power output of modern processor chips without necessarily increasing the bulk of the housing or the acoustic noise produced.

SUMMARY OF THE INVENTION

In accordance with one aspect of the invention, a heat generating component mounted in a housing of an electronic device is cooled by a cooling system including (1) a conduit defining an air flow path within the housing for delivering an air flow for cooling the heat generating component and (2) at least one fan for generating an air flow along the air flow path. The air flow path is substantially isolated from air in the remaining interior portion of the housing.

In a preferred embodiment, the conduit has an intake at a surface of the housing and an outlet located at a surface of the housing, wherein the air flow path extends from the intake to the outlet. A heat dissipation device, such as a heat sink configured to receive heat created by the heat generating component, can be positioned within the air flow path so the heat dissipation device extends over a substantial proportion of the cross-section of the air flow path.

With known systems, cooling efficiency can be compromised because the air that cools the components includes air already within the housing. The air within the housing is likely to be heated by other components and may thus be at too high a temperature to adequately cool components located generally downstream. Since the air outside the housing is in most home or office applications be at a lower temperature (perhaps 35° Celsius maximum) than the maximum temperature that can be tolerated within the housing (this might for instance be as high as 45° Celsius) a substantial gain in cooling efficiency is provided merely by drawing and expelling the cooler air outside the housing and keeping the cooler air flow isolated from the rest of the air inside the housing. In addition, the conduit can be made thermally insulating to further reduce the heat exchange between the cooling air flow and the rest of the housing.

Moreover, the fact that in many known arrangements cooling fans and the heat generating components they are intended to cool are located in the same relatively large compartment can make it difficult or costly to adequately soundproof the electronic device. Since, with the present invention, the fan can be located within the conduit, the conduit can provide an extra layer of acoustic insulation, if needed. Thus, an advantage of the above described arrangement is that, within a range of equipment of the same type, different levels of thermal and/or acoustic performance can be offered by a manufacturer simply by modifying the material used for the conduit, with potentially little or no other impact on the underlying configuration. The material used for the conduit thus is a design parameter that can be selected according to a desired level of thermal and/or acoustic performance and cost.

In modern personal computers much of the heat is generated by the processor chip and the power supply unit. Since the power supply unit generally includes its own cooling arrangements, the above described structure for cooling the processor chip obviates, in many designs, the need for active cooling of any other component. While the invention is particularly suitable for application in devices such as personal computers for the above reasons, its use in other types of electronic devices is however, not excluded.

DETAILED DESCRIPTION OF THE DRAWING

For simplicity and illustrative purposes, the principles of the present invention are described by referring mainly to an exemplary embodiment thereof. In the following description, numerous specific details are set forth in order to provide a thorough understanding of the present invention. It will be apparent however, to one of ordinary skill in the art, that the present invention can be practiced without limitation to these specific details. In other instances, well known methods and structure have not been described in detail so as not to unnecessarily obscure the present invention.

Figure 1A:
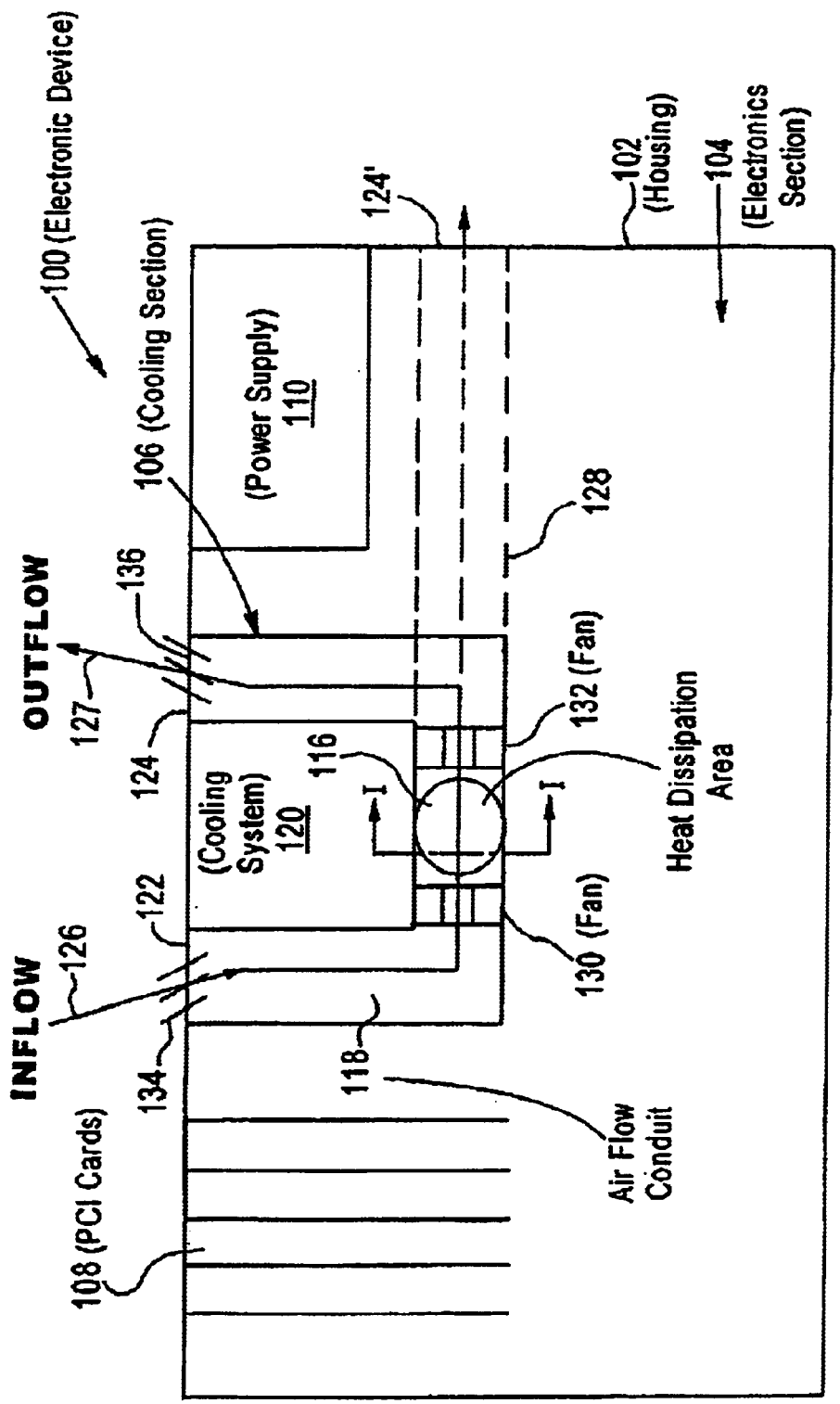
FIG. 1A is a simplified cross-sectional top view of an electronic device arrangement including an exemplary cooling system according to an embodiment of the invention.

FIG. 1A is a simplified cross-sectional top view of an electronic device 100 and a cooling system 120 according to an embodiment of the invention. The electronic device 100, e.g., a computer system having an ATX architecture, includes a housing 102, having an electronics section 104 and a cooling section 106. Also included within the housing 102 are electronic components e.g., peripheral component interconnect (PCI) cards 108, a power supply 110, and a heat generating component 112 shown in FIG. 1B (e.g., a processor, microcontroller, high speed video card, disk drive, semi-conductor device, and the like). It should be understood that the heat generating component 112 is frequently mounted on a printed circuit board (PCB) 113.

Figure 1B:
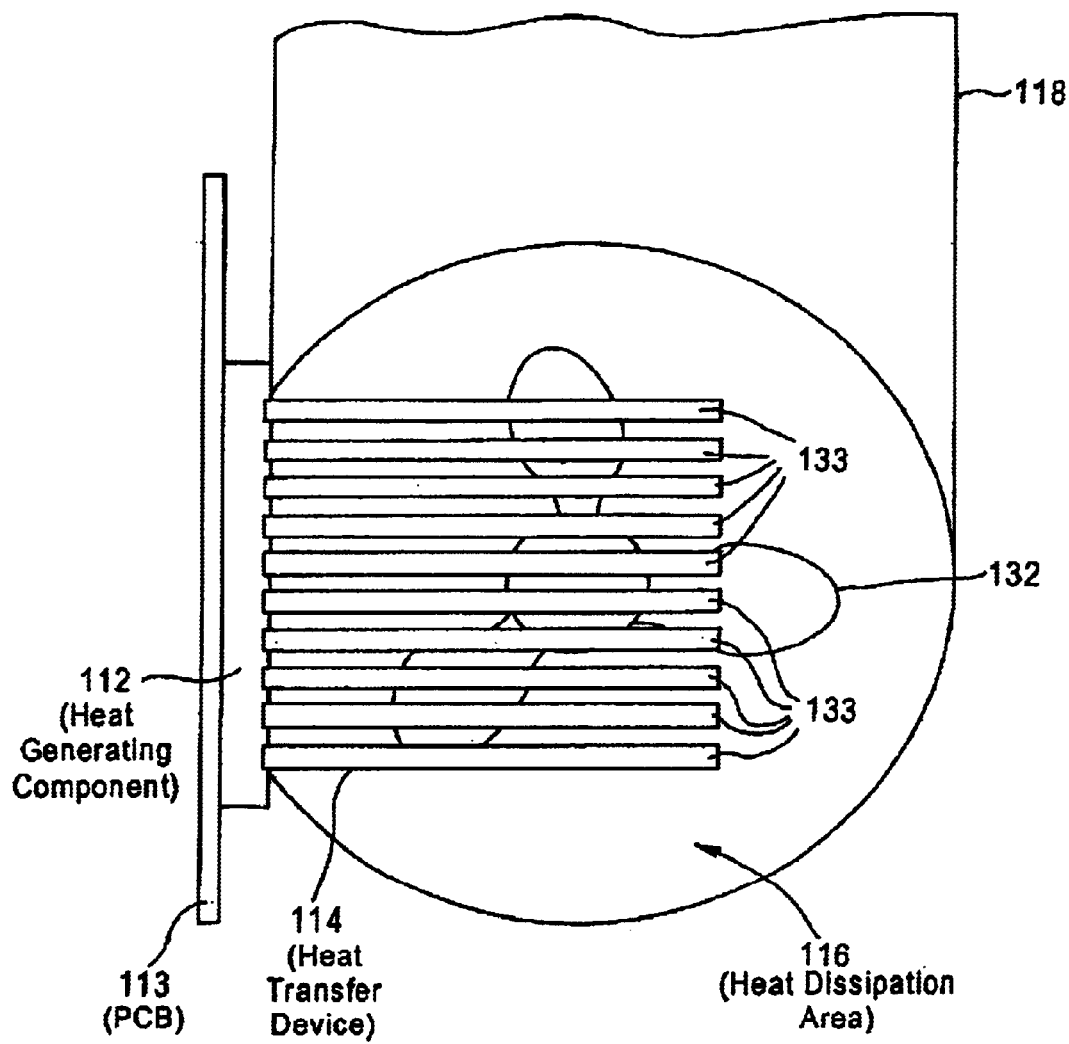
FIG. 1B is an enlarged cross-sectional view taken along lines I—I in FIG. 1A.

Referring to FIG. 1B, the heat generating component 112 is thermally attached to one or more heat transfer devices 114, e.g., heat sink, heat pipe, and the like. The heat transfer device 114 is attached to the heat generating component 112 in any manner that adequately enables the heat transfer device 114 to draw heat from the heat generating component, including, for example, by adhesive, mechanical fasteners, welding, and the like. More specifically, the heat transfer device 114 conveys heat from the heat generating component 112 to a heat dissipation area 116 of the cooling system 120.

The cooling system 120 is generally enclosed in the cooling section 106 of the housing 102. Therefore, the cooling system 120 is generally thermally and acoustically isolated from the other components located within the housing 102.

As illustrated in FIGS. 1A and 1B, the heat dissipation area 116 is generally located within an air flow conduit 118 that has a generally tubular configuration when viewed from a side cross-section. The conduit 118 is configured to draw outside air from the exterior of the housing 102 and direct the flow of the outside air through the heat dissipation area 116 and then back to the exterior of the housing 102. In this respect, the conduit 118 includes an air intake opening 122 and an air outlet opening 124. Thus, relatively cool outside air is drawn into the heat dissipation area 116 where the outside air is heated and then expelled from area 116 and the conduit 118, as indicated by the arrows 126 and 127. The conduit 118 can have any suitable cross-sectional size and shape designed to enable the above-described air flow, e.g., a polygonal configuration, a circular configuration, etc.

The air intake opening 122 and the air outlet opening 124 are located at opposite ends of the conduit 118. In this respect, air heated in the heat dissipation area 116 is removed from the housing 102 without substantially heating the air located in the remainder of housing 102, particularly in electronics section 104. Although the air outlet opening 124 is depicted as being located on the same wall of the housing 102 as the air intake opening 122, it should be understood that the openings 124 and 122 can be located on any respective wall of the housing 102 without deviating from the scope and spirit of the invention. For example, as an alternative the air outlet opening 124' is located on a wall adjacent to the air intake opening 122, with a portion 128 of the conduit 118 extending toward the air outlet opening 124' being shown with dotted lines.

In the embodiment illustrated in FIGS. 1A and 1B, the cooling assembly 120 includes two fans 130 and 132, respectively positioned upstream and downstream of the heat dissipation area 116. It should be understood that the fans 130 and 132 can be positioned at substantially any location within the conduit 118. The fans 130 and 132 are configured to cause air to be drawn into the heat dissipation area 116 from the air intake opening 122 and expelled through the air outlet opening 124. It should be understood that any suitable number of fans can be used to cause air to flow through the conduit 118, including a single fan. It is preferable, however, to provide more than one fan to substantially safeguard against damage to the heat generating component 112 if one of the fans were to malfunction. In addition, multiple fans usually increase the air flow volume and/or rate through the conduit 118 and thus effectuate a general increase in the cooling of the heat generating component 112.

Air deflectors 134 and 136 are respectively located generally adjacent to the air intake opening 122 and the air outlet opening 124. The air deflectors 134 and 136 are designed to orient and optimize the flow of air through the conduit 118 and to substantially minimize the recycling of air that has been heated in the heat dissipation area 116. In this respect, the air deflectors 134 and 136 are illustrated as facing in generally opposite directions. It should be understood that the air deflectors 134 and 136 can be oriented in any substantially reasonable direction.

The conduit 118 preferably includes a thermal insulating material to prevent the air within the conduit 118 from being heated by the air within the housing 102 and to prevent the air within the conduit 118 from heating the air within the housing 102. The conduit 118 is also preferably configured to substantially attenuate sound created by operation of the fans 130 and 132 and thereby substantially prevent sound from traveling through the walls of the conduit 118. Such attenuation can be achieved by judicious selection of the material from which the conduit 118 is made or alternatively, a separate soundproofing material and/or thermally insulating material can be provided around or inside the walls of the conduit 118. The insulating material and/or soundproofing material can be any suitable material, such as, polyurethane, polyethylene, polyester, inorganic fiber materials, and the like.

It will be appreciated that one advantage afforded by the structure of FIGS. 1A and 1B is that the material used for the conduit 118 is a design parameter that can be selected according to a desired level of thermal and/or acoustic performance and cost. While materials with very high levels of thermal and acoustic insulation exist, their extra cost is not justified in every application. Thus, within a range of equipment of the same type, different levels of thermal and/or acoustic performance can be offered by a manufacturer simply by modifying the material used for the conduit, with potentially little or no other impact on the underlying configuration.

As illustrated in FIG. 1B, the heat transfer device 114 extends over a substantial proportion of the cross-section of the conduit 118 and can comprise, for instance, a heat sink having a plurality of relatively thin plates (i.e., fins) 133 thermally attached to the heat generating component 112 in any reasonably suitable manner. The relatively thin plates usually comprise a material that is a relatively good heat conductor, e.g., aluminum. In addition, the relatively thin plates 133 are usually spaced apart from one another to generally enable cooling air to flow relatively freely therebetween. In operation, heat produced by the heat generating component 112 is conducted through the relatively thin plates of the heat transfer device 114 in the heat dissipation area 116. Operation of the fans 130 and 132 causes air from outside the housing 102 to flow through the relatively thin plates of the heat transfer device 114. The air flowing through the heat dissipation area 116 generally absorbs, by convection, some of the heat contained in the relatively thin plates. The heated air is forced from the heat dissipation area 116 and out of the conduit 118 through the air outlet 124 by operation of the fans 130 and 132.

As a consequence, the heat generating component 112 is substantially cooled and the heat produced therefrom is conveyed outside housing 102. The heat generated by the heat generating component 112 is removed without substantially affecting the temperature of other components contained within the electronic device 100. In addition, the air utilized to cool the heat generating component 112 is substantially unaffected by the heat produced by other components of the electronic device 100, e.g., the power supply 110, which in the case of personal computers is generally provided with their own cooling arrangements. Thus, the heat generating component 112 is cooled in a manner that is substantially more efficient and effective than with typical prior art cooling mechanisms.

Figure 2A:
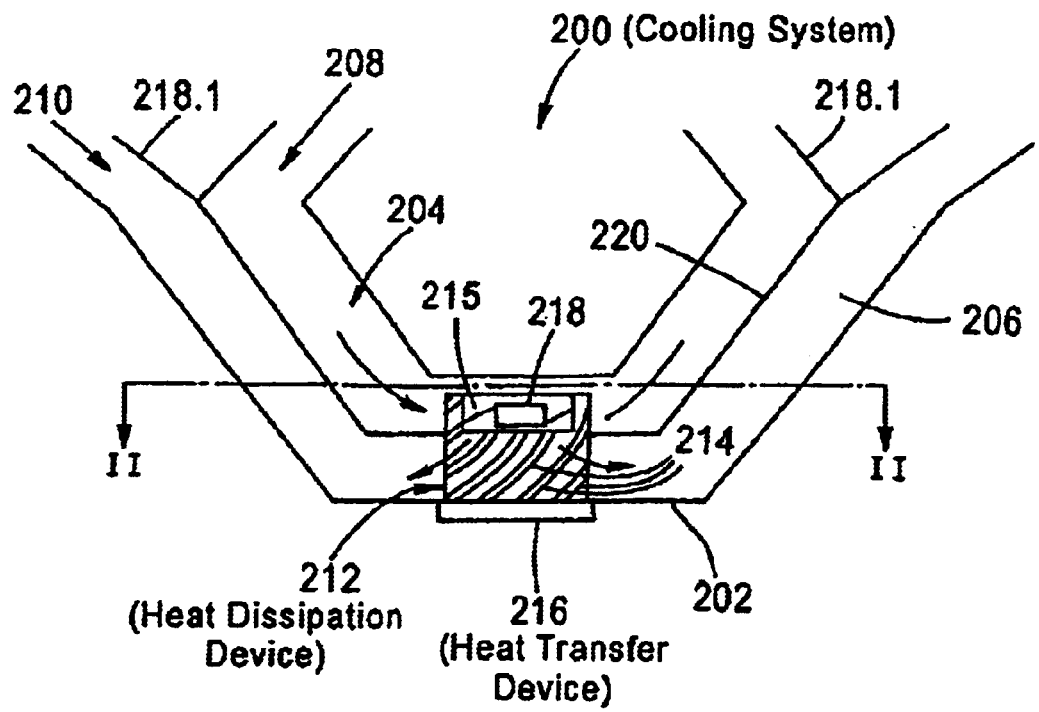
FIG. 2A is a simplified cross-sectional side view of a cooling system according to a second embodiment of the invention.

FIG. 2A is a simplified cross-sectional side view of a cooling system 200 according to a second embodiment of the invention. The cooling system 200 can be used to cool heat sink designs that have a fan positioned on top of the heat dissipation devices, e.g., a heat sink of the type generally described in U.S. Pat. No. 5,785,116 or U.S. Pat. No. 6,157,539 that have a heat transfer device 216 forming a base portion with an exterior surface extending from the base portion. Heat transfer device 216 is similar to heat transfer device 114 and physically and thermally contacts a heat generating component (not shown in FIGS. 2A or 2B) similar to component 112. This exterior surface has a plurality of openings with an intake air flow path extending through a first portion of the exterior surface and an exhaust air flow path extending through a second portion of the exterior surface, wherein the intake air flow path is substantially parallel to the exhaust air flow path. The heat dissipation device 212 has a plurality of spaced heat conducting members 214 (i.e., fins, made of, e.g., aluminum) in physical and thermal contact with heat transfer device 216 to provide heat transfer for heat produced by the heat generating device to the space between fins 214 via heat transfer device 216 and the fins.

As in the first embodiment, the cooling system 200 is positioned in the cooling section 106 of the electronic device 100. Therefore, the cooling system 200 is substantially isolated from other components within the electronic device 100, such as the heat generating component 112 located in the electronics section 104.

The cooling system 200 includes a conduit 202 having an inner air intake section 204 and an outer air expulsion section 206. The outer section 206 surrounds the inner section 204 in a generally coaxial configuration, with substantial portions of sections 204 and 206 being separated by a wall 220. The inner section 204 has an air intake opening 208 and the outer section 206 has an air outlet opening 210. The air intake opening 208 is adjacent to the air outlet opening 210. A plurality of air flow deflectors 218.1 are adjacent to the openings 208 and 210 to generally prevent air heated in a heat dissipation device 212 located within the conduit 202 from re-entering the conduit 202. A fan mechanism 218 is located in the vicinity of the heat dissipation device 212, so blades of the fan rotate about a vertical axis 213 of a cavity having a cylindrical wall 215 as illustrated in FIG. 2A.

In the embodiment shown in FIG. 2A, the heat sink is of the type described in U.S. Pat. No. 5,785,116 or U.S. Pat.

No. 6,157,539 and the common wall 220 separating the sections 204, 206 is positioned adjacent the exterior surface of the heat sink 212 to separate the intake and exhaust air flow paths.

The conduit 202 can have any suitable cross-sectional shape, e.g., circular, polygonal, and the like, to enable air flow through the heat dissipation device 212. Thus, although a generally frusto-conical shape for the upwardly directed portions of conduit 202 is illustrated, it should be understood that the walls of the conduit 202 can be cylindrical or positioned at any suitable angle. In addition, although reference is made to the inner section 204 as being used to draw air toward the heat dissipation device 212, it is to be understood that the outer section 206 can alternatively be used for this purpose according to the type of heat sink used. In this regard, the inner section 204 can also be used as a device for expelling air away from the heat dissipation device 212.

The fan mechanism 216 is configured to draw outside air into the heat dissipation device 212 through the inner section 204 and to expel air from the heat dissipation device 212 through the outer pipe section 206. Outside air in section 204 is drawn by fan 216 into cavity 215 through the space between fins 214 between the cavity and section 204. Fan 216 pushes the outside air in cavity 215 into outside section 206 through the space between fins 214 and that subsists essentially between the bottom of the cavity and section 206. In this respect, any suitable fan mechanism capable of achieving the above-described air flow through the air flow tube 202 can be used. It should be understood that any suitable number of fan mechanisms can be used to create the air flow. In addition, it may be preferable to utilize a plurality of fan mechanisms to maintain the air flow through the heat dissipation device 212 in the event of a fan mechanism failure.

Figure 2B:
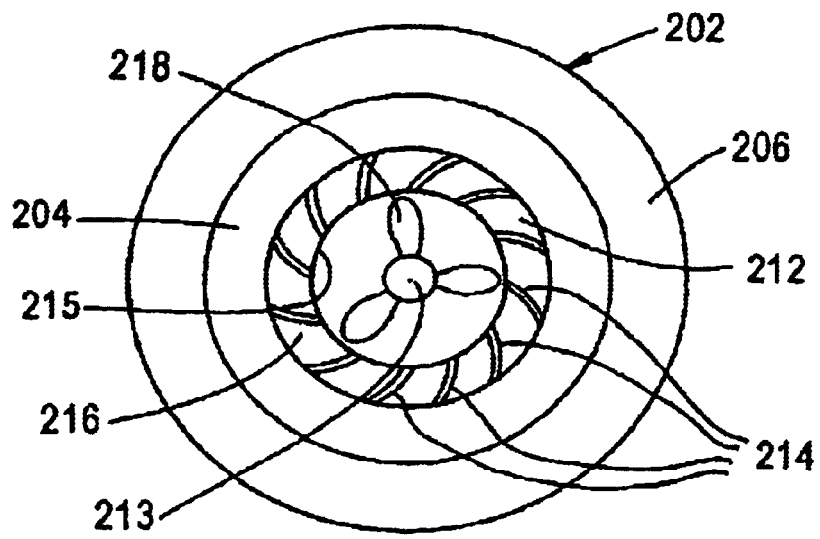
FIG. 2B is an enlarged top cross-sectional view of the cooling system illustrated in FIG. 2A taken along lines II—II.

FIG. 2B is a cross-sectional top view of the cooling system 200 illustrated in FIG. 2A. As illustrated, the conduit 202 has a generally circular cross-section and includes coaxial inner and outer sections 204 and 206. Fins 214 extend radially and circumferentially relative to axis 213 so that air propelled by the blades of fan 218 flows in the spaces between the fins from cavity 215 into section 206 in substantially the same direction that the air is propelled by the fan blade. It is within the purview of the invention that the conduit 202 can have any suitable cross-sectional shape, e.g., rectangular, square, triangular, lobed and the like. It should also be understood that in practical aesthetic designs the ends of the inner and outer sections 204 and 206 can be made as discreet as required.

The walls of the inner section 204 and the outer section 206 as well as the wall 220 separating the sections 204, 206 are preferably made of thermal insulating material to prevent substantial heat transfer between the sections 204 and 206 and between the conduit 202 and the remainder of the electronic device. These walls can also include any suitable soundproofing material, such as polyurethane, polyethylene, inorganic fiber materials and the like, to minimize the travel of noise through the walls.

There has been described a cooling system that includes an air flow conduit configured to cause air to flow through a heat dissipation device. The conduit is configured to substantially prevent the transfer of heat from the air contained within the conduit and the air contained in a surrounding enclosure. By virtue of the substantially enclosed and isolated flow of air through the air flow conduit, the cooling of the heat generating component is effectuated with relatively greater efficiency and effectiveness than typical prior art arrangements.

What has been described and illustrated herein is a preferred embodiment of the invention along with some of its variations. The terms, descriptions and figures used herein are set forth by way of illustration only and are not meant as limitations. For instance, other cooling systems in an isolated cooling section can be used to cool the electronic package. Those skilled in the art will recognize that many variations are possible within the spirit and scope of the invention, which is intended to be defined by the following claims, and their equivalents, in which all terms are meant in their broadest reasonable sense unless otherwise indicated.

What is claimed is:

1. An electronic device comprising:
   a heat generating component mounted in a housing, and a cooling system operable to cool the heat generating component, said cooling system comprising a conduit for providing an air flow path within the housing for delivering an air flow for cooling said heat generating component, said air flow path being substantially isolated from air in the remainder of the interior of the housing, and at least one fan for generating an air flow along the air flow path, said conduit comprising an air inlet conduit and an air outlet conduit, the inlet and outlet conduits having a common wall separating a portion of the air inlet conduit from at least a portion of the air outlet condtit.

2. An electronic device as claimed in claim 1, further comprising a heat dissipation device configured to receive heat created by said heat generating component, and wherein said heat dissipation device is positioned within said air flow path and extends over a substantial proportion of a cross-section of the air flow path.

3. An electronic device as claimed in claim 2, wherein the heat dissipation device is a heat sink.

4. An electronic device as claimed in claim 1, wherein the conduit has an outside air intake at a surface of the housing for enabling air outside the housing to flow into the conduit and an air outlet located at a surface of the housing for expelling air heated by heat from the heat generating component, the conduit being arranged so the heated air flowing in the conduit can flow from the conduit to outside the housing, the air flow path extending from said intake to said outlet.

5. An electronic device as claimed in claim 4, wherein at least one of the intake and the outlet comprises deflectors for substantially preventing recycling of air from the outlet to the inlet.

6. An electronic device as claimed in claim 1, wherein the fan is positioned within the air flow path.

7. An electronic device as claimed in claim 1, wherein said conduit has a generally circular cross-section.

8. An electronic device as claimed in claim 1, wherein the conduit includes insulating material configured to generally prevent conduction therethrough of at least one of heat and/or sound.

9. An electronic device as claimed in claim 1, wherein the air inlet conduit surrounds the air outlet conduit or the air outlet conduit surrounds the air inlet conduit.

10. An electronic device as claimed in claim 9, comprising a heat dissipation device having a base portion and an exterior surface extending from said base portion, said exterior surface comprising a plurality of openings with an intake air flow path extending through a first portion of the said exterior surface and an exhaust air flow path extending through a second portion of the exterior surface, the common wall extending from the exterior surface for separating the intake air flow from the exhaust air flow path.

11. An electronic device as claimed in claim 10, wherein the intake air flow path is substantially parallel to said exhaust air flow path.

12. An electronic device as claimed in claim 1, comprising a heat dissipation device having a base portion and an exterior surface extending from said base portion, said exterior surface comprising a plurality of openings with an intake air flow path extending through a first portion of the said exterior surface and an exhaust air flow path extending through a second portion of the exterior surface, the common wall extending from the exterior surface for separating the intake air flow from the exhaust air flow path.

13. An electronic device as claimed in claim 12, wherein the intake air flow path is substantially parallel to said exhaust air flow path.

14. An electronic cooling device comprising:

a heat generating component mounted in a housing, and
a cooling system operable to cool the heat generating component, said cooling system comprising a conduit for providing an air flow path within the housing for delivering an air flow, the air flow path being substantially isolated from air in the remainder of the interior of the housing, and at least one fan for generating an air flow along the air flow path, the cooling system, the at least one fan, and the air flow path being arranged for causing air in the path to be drawn radially into the cooling system and to be expelled radially from the cooling system, the at least one fan including a fan positioned within the cooling system for drawing air radially into the cooling system relative to a first side of a plane lane and for expelling air from the cooling system relative to a second side of the plane, the cooling system including fins that are arranged with respect to the fan for causing air propelled by the fan to flow in substantially the same direction in spaces between the fins as the air is propelled by the fan, and the fins extending radially and circumferentially with respect to an axis about which a blade of the fan positioned within the cooling system turns.

15. The electronic device of claim 14, wherein the cooling system, the at least one fan, and air flow path are arranged for causing air (a) to be drawn radially into the cooling system relative to a first side of a plane and (b) to be expelled radially from the cooling system relative to a second side of the plane.

* * * * *